United States Patent
Yang et al.

(10) Patent No.: US 7,843,761 B2
(45) Date of Patent: Nov. 30, 2010

(54) SEMICONDUCTOR MEMORY DEVICE

(75) Inventors: Sun-Suk Yang, Kyoungki-do (KR); Yong-Ki Kim, Kyoungki-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 162 days.

(21) Appl. No.: 12/136,513

(22) Filed: Jun. 10, 2008

(65) Prior Publication Data

US 2009/0086564 A1 Apr. 2, 2009

(30) Foreign Application Priority Data

Sep. 27, 2007 (KR) ...................... 10-2007-0097149

(51) Int. Cl.
*G11C 8/00* (2006.01)
(52) U.S. Cl. ...................... 365/230.08; 365/230.04; 365/233.1
(58) Field of Classification Search ............. 365/230.08, 365/233.1, 230.01
See application file for complete search history.

(56) References Cited

U.S. PATENT DOCUMENTS

| 5,903,496 | A | 5/1999 | Kendall et al. |
| 6,222,767 | B1 * | 4/2001 | Kendall et al. ......... 365/185.12 |
| 6,425,062 | B1 * | 7/2002 | Kendall et al. ............ 711/167 |
| 7,203,107 | B2 * | 4/2007 | Yeh .......................... 365/200 |
| 7,372,766 | B2 * | 5/2008 | Park et al. ............. 365/230.06 |

OTHER PUBLICATIONS

Foreign Office Action issued on Sep. 22, 2008, KR application No. 10-2007-0097149.

* cited by examiner

*Primary Examiner*—Pho M Luu
(74) *Attorney, Agent, or Firm*—IP & T Group LLP

(57) ABSTRACT

A semiconductor memory device is capable of securing margins of setup/hold times for receiving addresses. The device includes an address buffering unit, a data input/output line, a selecting unit and an output circuit. The address buffering unit buffers input addresses. The data input/output line transfers data with a cell array. The selecting unit selectively outputs the buffered addresses transferred from the address buffering unit and the data transferred through the data input/output line according to modes of the device. The output circuit latches an output of the selecting unit to be outputted from the device.

14 Claims, 2 Drawing Sheets

SEMICONDUCTOR MEMORY DEVICE

CROSS-REFERENCE TO RELATED APPLICATION

The present invention claims priority of Korean patent application number 10-2007-0097149, filed on Sep. 27, 2007, which is incorporated by reference in its entirety.

BACKGROUND OF THE INVENTION

The present invention relates to a semiconductor memory device, and more particularly to a semiconductor memory device that can secure margins of setup/hold times of an address.

A semiconductor memory device is provided with an address buffering unit for buffering external addresses. The address buffering unit latches the buffered addresses using an internal clock as a strobe signal.

FIG. 1 is a block diagram of a conventional address buffering unit.

The address buffering unit includes a buffering unit 110 and a latching unit 120. The buffering unit 110 receives addresses from an external chipset to buffer the addresses to an internal CMOS level of a semiconductor memory device. The latching unit 120 synchronizes the buffered addresses ADD_OUT received from the buffering unit 110 with an internal clock CLK_ADD, thereby outputting an internal addresses AN.

The addresses are input in synchronization with a rising edge of an external clock with margins of setup/hold times, and then latched in synchronization with a rising edge of the internal clock. This is referred to as a single data rate (SDR) type. However, in the Graphics Double Data Rate, version 5 (GDDR5) Dynamic Random Access Memory (DRAM), the addresses are input in synchronization with rising/falling edges of the external clock with margins of setup/hold times, and then latched in synchronization with both rising/falling edges of the internal clock. This is referred to as a double data rate (DDR) type.

This means that the addresses are transferred at the same speed as data at a data bit rate of GDDR3/GDDR4 DRAM. That is, when tCK=1 GHz, the addresses are transferred at a speed of 1 Gbps and the data is input/output in synchronization with rising/falling edges of a clock to be transferred at a speed of 2 Gbps in GDDR3/GDDR4 DRAM. However, in a GDDR5 DRAM, the addresses are also input in synchronization with both the rising/falling edges of the clock to be transferred at a speed of 2 Gbps. This may decrease a reliability of the address input.

In the conventional GDDR DRAM, a DQS signal, which is a data strobe signal, is input in synchronization with a data DQ at every one byte (every eight DQ's) to secure a bit rate of 2 Gbps of the data DQ. The DQS signal serves to latch the data DQ, and the data DQ and the DQS signal are source-synchronized signals transferred in the same path from a chipset to the memory device. Therefore, reliability of inputting the data DQ can be secured.

In the GDDR5 DRAM, the addresses are input in the DDR type manner and thus at the same speed as the data DQ. However, the addresses are input in synchronization with the external clock instead of a source-synchronized signal such as the DQS signal. Therefore, it is difficult to secure margins of the setup/hold times for latching the addresses.

SUMMARY OF THE INVENTION

Embodiments of the present invention are directed to providing a semiconductor memory device that can secure margins of setup/hold times for receiving addresses.

A GDDR5 DRAM receives addresses at a speed two times higher than that of a clock. Therefore, a new operation of address training is developed. In this operation, the semiconductor memory device receives addresses from an external chipset and outputs the addresses back to the chipset. Then, the chipset checks whether the addresses received back are identical to the addresses initially output. As such the semiconductor memory device can find a period where the addresses are recognized correctly, and thus a window for latching the addresses without error.

In accordance with an aspect of the invention, a semiconductor memory device includes an address buffering unit configured to buffer input addresses, a data input/output line configured to transfer data with a cell array, a selecting unit configured selectively to output the buffered addresses transferred from the address buffering unit and the data transferred through the data input/output line according to modes of the device, and an output circuit configured to latch an output of the selecting unit to be outputted from the device.

In accordance with another aspect of the invention, a semiconductor memory device includes a selecting unit configured to selectively output addresses received by the device and data stored in the device, according to modes of the device, and an output circuit configured to output from the device an output of the selecting unit.

DESCRIPTION OF SPECIFIC EMBODIMENTS

Hereinafter, a semiconductor memory device in accordance with the present invention will be described in detail with reference to the accompanying drawings.

Figure 1:
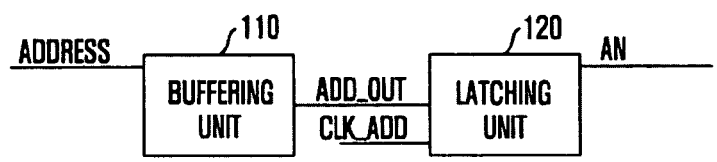
FIG. 1 is a block diagram of a conventional address buffering unit.
Figure 2:
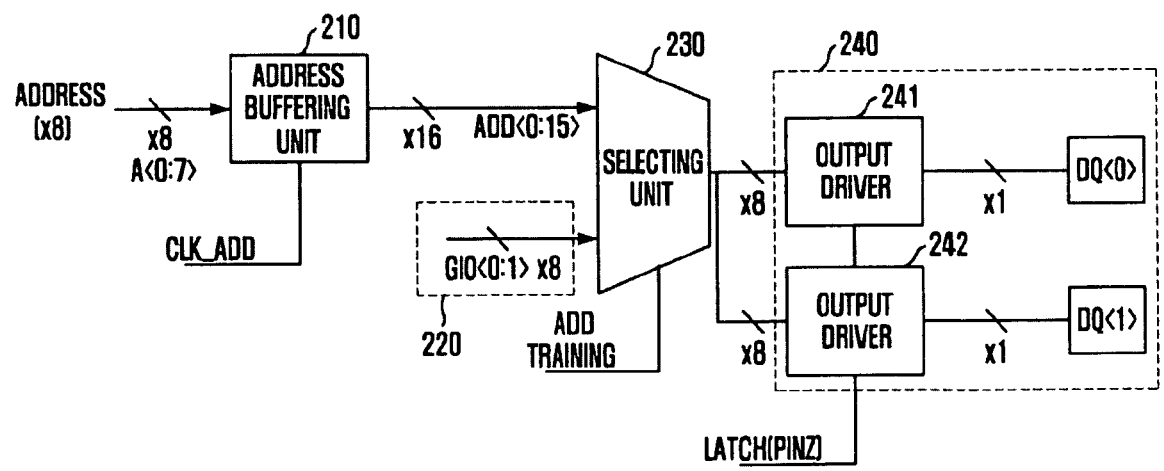
FIG. 2 is a block diagram of a semiconductor memory device in accordance with an embodiment of the present invention.

FIG. 2 is a block diagram of a semiconductor memory device in accordance with an embodiment of the invention.

Referring to FIG. 2, the semiconductor memory device includes an address buffering unit 210, a data input/output line 220, a selecting unit 230, and an output circuit 240.

The address buffering unit 210 receives addresses from a chipset. The address buffering unit 210 buffers the addresses to a signal level of the semiconductor memory device and latches the buffered addresses in synchronization with an internal address latch clock CLK_ADD.

In more detail, the address buffering unit 210 receives the addresses of an 8-bit signal through eight address pads and buffers them to a CMOS level of the semiconductor memory device. Then, the address buffering unit 210 latches the buffered addresses in synchronization with the internal address latch clock CLK_ADD.

As described above, in the GDDR5 DRAM, the addresses are input to the address buffering unit 210 in the DDR type manner, i.e., in synchronization with both rising and falling edges of the external clock. Thus, the received addresses are latched in synchronization with both the rising and falling edges of the internal address latch clock CLK_ADD. Then, the addresses synchronized with the rising edges and the addresses synchronized with the falling edges are output in parallel. Therefore, an addresses ADD<0:15> output from the address buffering unit 210 are 16-bit signals.

The data input/output line 220 transfers data from/to a cell array of the semiconductor memory device. A typical example of the data input/output line 220 is a global input/output (GIO) line. An operation of outputting the data from the cell array is described below with reference to FIG. 2.

The selecting unit 230 outputs one of the addresses ADD<0:15> received from the address buffering unit 210 and the data GIO<0:1>×8 received through the data input/output line 220 according as which of a first mode and a second mode is selected. That is, the selecting unit 230 outputs the addresses when the first mode (i.e., an address training mode) is selected, and outputs the data when the second mode (i.e., a normal mode) is selected.

In more detail, the selector 230 may include a general multiplexer MUX to select one of the data and the addresses in response to an address training signal ADD TRAINING that is activated in the address training mode.

A total of sixteen addresses ADD<0:15> are received in parallel, including eight addresses synchronized with the rising edge and eight addresses synchronized with the falling edge. Therefore, the number of the addresses are identical to the number of the data GIO<0:1>×8 received through the data input/output line 220. In an operation of the GDDR5 DRAM where a burst length BL is 8, eight serialized data are output through each DQ pin. Accordingly, the selecting unit 230 outputs eight signals at a time to each output driver 241 or 242, which are denoted by "×8" in FIG. 2.

The output circuit 240 outputs the addresses or the data selected by the selecting unit 230 to an outside. The output circuit 240 may include output drivers 214 and 242, and output pins DQ<0> and DQ<1>. The output drivers 241 and 242 each latches the addresses or the data in serial in response to a control signal LATCH[PINZ] according to the burst length BL of the semiconductor memory device. The output pins DQ<0> and DQ<1> receive outputs of the output drivers 241 and 242 to output them to the outside. Data output pins of the semiconductor memory device, i.e., DQ pins, can be used as the output pins DQ<0:1>. The output circuit 240 is different from the conventional output circuit in that the output circuit 240 outputs addresses as well as data, whereas the conventional output circuit outputs data only.

Since a total of sixteen addresses are input through eight pins in synchronization with the rising and falling edges of the external clock as described above, the sixteen addresses may be output to the DQ pins DQ<0:1> through the two output drivers 241 and 242 in the address training mode.

The address training is an operation for finding a setup/hold window of the addresses when the semiconductor memory device is turned on. The chipset repeatedly performs the address training until the window is found. When the chipset outputs the addresses and an address training command to the semiconductor memory device, the semiconductor memory device outputs the addresses back to the chipset through the DQ pins DQ<0:1>. Then, the chipset compares the addresses initially output to the semiconductor memory device and the addresses received back through the DQ pins DQ<0:1> of the semiconductor memory device and determines pass/fail of the result. When the result is determined to be a fail, the chipset outputs again the address training command and delayed addresses to the semiconductor memory device to determine pass/fail of the result again.

By repeatedly performing the address training, the passed period and the failed period of outputting addresses can be figured out. If the chipset outputs the addresses to the semiconductor memory device at a center of the passed period, the semiconductor memory device can receive the addresses within the setup/hold times of the corrected timing. As such, the semiconductor memory device can perform a stable address latch operation.

As described above, the semiconductor memory device includes a selecting unit 230 that outputs the addresses received from the external chipset or the data stored in the memory cell according as which of the first mode (the address training mode) or the second mode (the normal mode) is selected. As such, the semiconductor memory device can perform the address training completely, and thus can receive the addresses in a stable manner.

Figure 3:
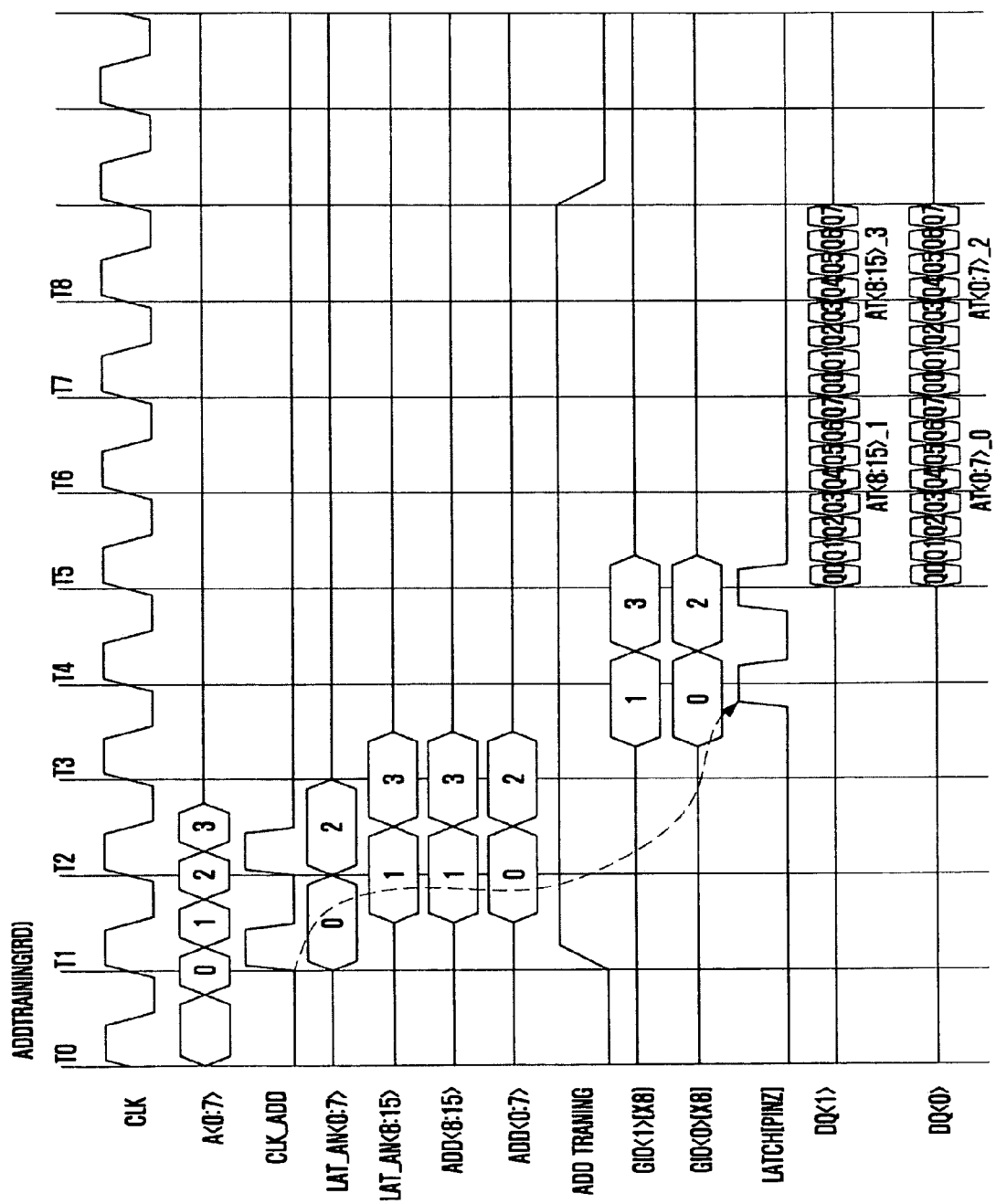
FIG. 3 is a timing diagram illustrating an operation of the semiconductor memory device of FIG. 2.

FIG. 3 is a timing diagram illustrating an operation of the semiconductor memory device of FIG. 2.

FIG. 3 illustrates the case where two address training commands are sequentially input to the semiconductor memory device so that the address training is performed twice. When addresses A<0:7> are input to the semiconductor memory device through the eight address pins, the address buffering unit 210 latches them in synchronization with rising and falling edges of the address latch clock CLK_ADD to output latched addresses ADD<0:7> and ADD<8:15>. Then, the output circuit 240 serializes the latched addresses ADD<0:7> and ADD<8:15> to output trained addresses AT<8:15> and AT<0:7> through two pins DQ<0:1>. Referring to FIG. 3, a total of thirty two trained addresses AT<8:15>_1, AT<8:15>_3, AT<0:7>_0 and AT<0:7>_2 are output because two address trainings are performed sequentially.

As described above, the semiconductor memory device can secure appropriate margins of setup/hold times for an address input according to the address training and thus can receive the addresses stably, even when the addresses are input at high speed from the chipset.

While the invention has been described with respect to the specific embodiments, it will be apparent to those skilled in the art that various changes and modifications may be made without departing from the spirit and scope of the invention as defined in the following claims.

What is claimed is:

1. A semiconductor memory device, comprising:
an address buffering unit configured to buffer an input address;
a data input/output line configured to transfer data stored in a cell array;
a selecting unit configured to select, in response to operation modes of the device, one of the buffered input address and the transferred data as an output of the selecting unit and output the selected output; and
an output circuit configured to latch the selected output of the selecting unit as an output of the device.

2. The semiconductor memory device as recited in claim 1, wherein the address buffering unit is configured to buffer the input address to have an internal signal level of the device and synchronize buffered address with an internal clock.

3. The semiconductor memory device as recited in claim 1, wherein the selecting unit includes a multiplexer configured to receive the input address and the data.

4. The semiconductor memory device as recited in claim 3, wherein the multiplexer is configured to output the input address in a first of the operation modes and the data in a second of the operation modes, in response to a signal activated according to the operation modes.

5. The semiconductor memory device as recited in claim 4, wherein the multiplexer is configured to output the selected one of the address and the data in parallel according to a burst length of the device.

6. The semiconductor memory device as recited in claim 1, wherein the output circuit includes:
   an output driver configured to latch the output of the selecting unit in series according to a burst length of the device; and
   an output pin configured to output from the device an output of the output driver.

7. The semiconductor memory device as recited in claim 6, wherein the output pin includes a DQ pin of the device.

8. The semiconductor memory device as recited in claim 1, wherein the data input/output line includes a global input/output line of the device.

9. The semiconductor memory device as recited in claim 1, wherein the operation modes includes an address training mode and a normal mode.

10. A semiconductor memory device, comprising:
    a selecting unit configured to select, in response to operation modes of the device, one of an output address received by the device and data stored in a cell array as an output of the selecting unit and output the selected output; and
    an output circuit configured to output from the device the selected output of the selecting unit.

11. The semiconductor memory device as recited in claim 10, wherein the selecting unit includes a multiplexer.

12. The semiconductor memory device as recited in claim 11, wherein the selecting unit further includes:
    an address buffering unit for buffering the address and synchronizing the buffered address with an internal clock as an output to the multiplexer; and
    a data input/output line for transferring the data stored in the cell array to the multiplexer.

13. The semiconductor memory device as recited in claim 10, wherein the output circuit includes:
    an output driver configured to latch the output of the selecting unit according to a burst length of the device; and
    an output pin configured to output from the device an output of the output driver.

14. The semiconductor memory device as recited in claim 10, wherein the operation modes includes an address training mode and a normal mode.

* * * * *